(12) United States Patent
Yeh et al.

(10) Patent No.: US 6,303,454 B1
(45) Date of Patent: Oct. 16, 2001

(54) PROCESS FOR A SNAP-BACK FLASH EEPROM CELL

(75) Inventors: Juang-Ker Yeh, Hsin-Chu; Jian-Hsing Lee, Hsing-Chu; Kuo-Reay Peng, Fangshan; Ming-Chou Ho, Taichung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/590,849

(22) Filed: Jun. 9, 2000

Related U.S. Application Data

(62) Division of application No. 09/017,408, filed on Feb. 2, 1998, now abandoned.

(51) Int. Cl.[7] .................................................. H01L 21/336
(52) U.S. Cl. ........................ 438/305; 438/306; 438/307; 438/257; 438/265
(58) Field of Search .................................. 438/303, 305, 438/306, 307, 291, 257, 261, 265

(56) References Cited

U.S. PATENT DOCUMENTS

| | | | |
|---|---|---|---|
| 5,427,963 | 6/1995 | Richart et al. | 437/41 |
| 5,485,423 | 1/1996 | Tang et al. | 365/185 |
| 5,486,480 | * 1/1996 | Chen | 437/29 |
| 5,607,869 | 3/1997 | Yamazaki | 437/40 |
| 5,650,340 | * 7/1997 | Burr et al. | 437/30 |
| 5,763,312 | * 6/1998 | Jeng et al. | 438/303 |
| 5,854,108 | * 12/1998 | Hsu et al. | 438/257 |

OTHER PUBLICATIONS

Yuan Tang et al. "Different Dependence of Band to Band and Fowler–Nordheim Tunneling on Source Doping Concentration of an n–MOSFET" IEEE Electron Device Letters. vol. 17, No. 11, Nov. 1996. p. 525–6.

* cited by examiner

Primary Examiner—Eddie Lee
Assistant Examiner—N. Drew Richards
(74) Attorney, Agent, or Firm—George O. Saile; Stephen B. Ackerman; William J. Stoffel

(57) ABSTRACT

The present invention provides method to fabricate a snap-back flash EEPROMS device. The method begins by forming a gate structure 22 24 28 26 on a substrate. The gate structure comprises: a tunnel oxide layer 22, a floating gate 24, integrate dielectric layer 28, and a control gate 26. A drain 14 is formed adjacent to the gate structure by an masking 51 and ion implant process. Next, a source side doped region 18 is formed adjacent to and under a portion of the gate structure 22 24 28 26 by an masking and ion implant process. Spacers 32 are now formed on the sidewalls of the gate structure. A source 20 is formed overlapping portion of the side source doped region 18 and adjacent to the spacers 32. The side source doped region has a lower dopant concentration than the source 20. This method forms a snap-back memory cell wherein the side source doped region 18 is used to apply a high voltage to operate the EEPROM cell in a snap-back erase mode.

14 Claims, 6 Drawing Sheets

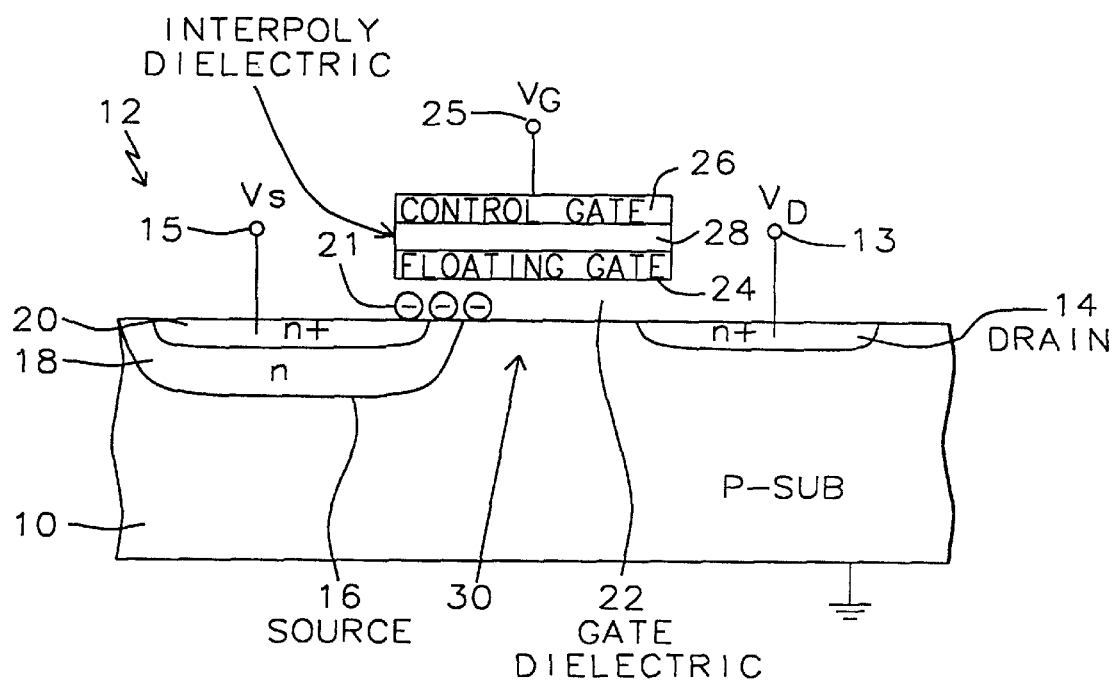
FIG. 1A – Prior Art

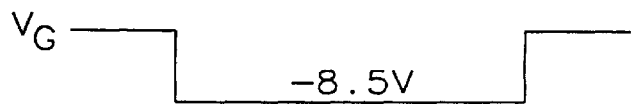
FIG. 2A — Prior Art
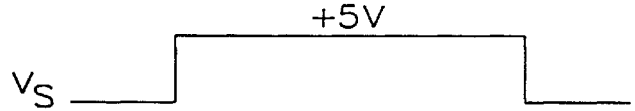
FIG. 2B — Prior Art
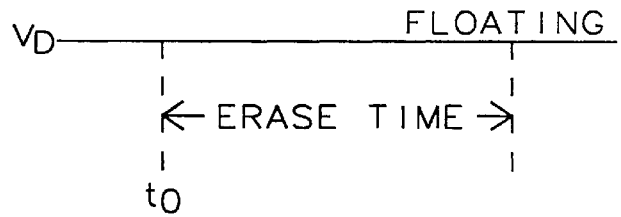
FIG. 2C — Prior Art
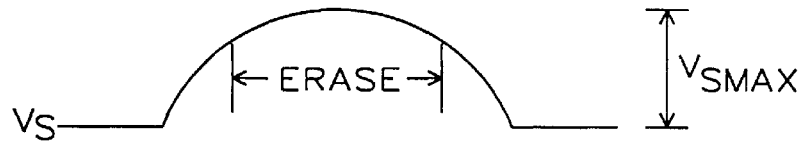
FIG. 3A
FIG. 3B
FIG. 3C
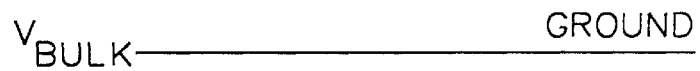
FIG. 3D
FIG. 3E

| HOT CARRIER GENERATION AND CURRENT COMPONENTS (SHOWN IN FIG. 4B) ||
|---|---|
| ELEMENT NUMBER | ELEMENT |
| 51 | HOLES REACHING THE DRAIN |
| 52 | ELECTRON INJECTION FROM THE DRAIN |
| 53 | SUBSTRATE HOLE CURRENT |
| 54 | ELECTRON INJECTION INTO THE OXIDE |

PROCESS FOR A SNAP-BACK FLASH EEPROM CELL

This is a divisional of patent application Ser. No. 09/017,408, filing date Feb. 2, 1998, now abandonded, titled; A Process for a Snap-back Flash EFPROM Cell, assigned to the same assignee as the present invention.

This patent is related to co-pending U.S. patent application Ser. No. 08/949,945 filed Oct. 14, 1997, entitled; "Snap-back Reduces The Electron And Hole Trapping In The Tunneling Oxide Of Flash EEPROM".

BACKGROUND OF INVENTION

1) Field of the Invention

This invention relates generally to floating gate memory devices such as an array of flash electrically erasable and programmable read-only memory devices (EEPROMS) and more particularly, the present invention is directed to a method for manufacturing a Snap-Back Flash memory cell that uses a snap-back erase operation that prevents cycling-induced electron and hole trapping in the tunneling oxide of flash EEPROMS.

2) Background of the Invention

Flash EEPROMS have recently emerged as an important memory device by combining the advantages of EPROM density with EEPROM electrical erasability. Such flash EEPROM's provide electrical erasing and a small cell size. FIG. 1A illustrates a prior art cross-sectional view of a flash EEPROM cell 12. The EEPROM cell is formed of a substrate 10, typically of a p-type conductivity, having embedded therein an n+ drain region 14 and a n-type double-diffused source region 16. See E.g., U.S. Pat. No. 5,485,423(Tang et al.).

A relatively thin gate dielectric layer 22 (i.e., tunnel oxide or an oxide having a uniform thickness of about 100 Å) is interposed between the top surface of the substrate 10 and a conductive polysilicon floating gate 24. A polysilicon control gate 26 is insulated above the floating gate 24 by an inter-poly dielectric 28. A channel region 30 in the substrate 10 separates the drain region 14 and the source region 16 Further, there are provided terminal pins 15, 25, and 13 for applying a source voltage Vs to the source region 16, a gate voltage Vg to the control gate 26, and a drain voltage Vd to the drain region 14, respectively.

In conventional operation, the flash EEPROM cell (i.e., NON-snap-back flash cell) of FIG. 1A is "programmed" by applying a relatively high voltage V, (approximately +9 volts) to the control gate via the terminal pin 25 and a moderately high voltage Vd (approximately +5 volts) to the drain region 14 via the terminal pin 13 in order to produce "hot" (high energy) electrons in the channel 30 near the drain region 14. The source region 16 is connected to a ground potential (Vs=0) via the terminal pin 15. The hot electrons are generated and accelerated across the gate dielectric 22 and onto the floating gate 24 and become trapped in the floating gate since the floating gate is surrounded by insulators. As a result, the floating gate threshold may be increased by three to five volts. This change in the threshold voltage, or channel conductance, of the cell created by the trapped hot electrons is what causes the cell to be programmed.

In order to erase the flash EEPROM cell of FIG. 1A, a positive voltage Vs is applied to the source region 16 via the terminal pin 15 while the control gate 26 via the terminal pin 25 is either grounded (Vg=0) or biased to a negative voltage dependent upon whether the positive voltage Vs applied to the source region 16 has a value of +12 V or +5 V In a "12 Volt flash EEPROM" device, the bias condition of Vs=+12V and Vg=0is used. In a "5 Volt Only flash EEPROM" device, the bias condition of Vs=+5 V and Vg=−8.5 V is used. The drain region 14 is usually allowed to float. Under either of these conditions, a strong electric field is developed across the tunnel oxide between the floating gate and the source region. The electrons trapped in the floating gate flow toward a cluster at the portion of the floating gate overlying the n+-type source region 16 and are extracted from the floating gate 24 to the source region 16 by way of Fowler-Nordheim (F-N) tunneling.

However, some of the electrons 21 will remain trapped in the tunnel oxide 22 adjacent the top surface of the substrate 10 as depicted in FIG. 1A. This electron and hole trapping will occur in the whole memory array and will tend to increase the erase time as a function of the number of program/erase cycles. As the number of program/erase cycles goes beyond the 100,000 number, the erase time required to erase every cell in the entire memory array to a certain threshold $V_T$ in order to pass the erase verify mode of operation will exceed the time limit of 10 seconds. It is generally assumed that if the entire memory array cannot be erased within the time limit of 10 seconds (i.e., 1 pulse/10 ms or 1,000 pulses), a cycling failure is considered to have occurred.

Therefore, the problem of electron and hole trapping in the tunneling oxide to reduce the tunneling electric field for such conventional EEPROM devices is of a major concern since it causes the erase time to be prolonged beyond the limit of 10 seconds (i.e., 1 pulse/10 ms), thereby significantly limiting the endurance of the cells. As used herein, the term "endurance" refers to the number of times the memory cells in the array may be re-programmed and erased. Consequently, the electron and hole trapping problem greatly reduces the endurance of the cells to be less than 100,000. In addition, the hole trapping caused by F-N tunneling current is also a serious issue. The hole trapping in the tunnel oxide will cause the Vt window opening and erratic bit.

In addition, some EEPROMS devices use Fowler-Nordheim (FN) tunneling in both the erase and program cycles. The above electron and hole trapping problem slows the program cycle also. FIGS. 2A–2C, show the conventional square pulse waveforms used in conventional EEPROM erase cycles. The inventor realized that the electron and hole trapping problem could be reduced by modifying the conventional waveforms for erase cycle. Furthermore, the inventor realized that better methods must be developed to fabricate a Snap-back EEPROM cell that are specially designed for snap-back operation.

The importance of overcoming the various deficiencies noted above is evidenced by the extensive technological development directed to the subject, as documented by the relevant patent and technical literature. The closest and apparently more relevant technical developments in the patent literature U.S. Pat. No. 5,607,869(Yamazaki) and U.S. Pat. No. 5,427,963(Richart et al.) that show methods of making asymmetric Lightly doped source transistors used in conventional non-snap-back cells. U.S. Pat. No. 5,485,423 (Tang) shows a method for applying a relative low positive voltage to a source region of an EEPROM during the erase cycle. "Different Dependence of Band to Band and Fowler-Nordheim Tunneling on Source Doping concentration of an N-MOSFET", by Yuan Tang et al., IEEE Electron Device Letters, vol. 17, No. 11, November 1996, pp. 525–526, discuss the FN tunneling as a function of source doping.

However, there exists a need for a new method to fabricate a Flash EEPROM cell this is specially designed for a SNAP-Back erase operation.

SUMMARY OF THE INVENTION

Accordingly, it is a general object of the present invention to provide an improved method of forming a flash EEPROM cell that uses a snap-back erasure method.

It is an object of the present invention to provide an improved method for forming a flash EEPROM cell that uses a Snap-back erasure method which is preferably realized by applying a high magnitude sine waveform for the Vs erase cycles.

It is an object of the present invention to provide an improved method for forming a flash EEPROM cell that uses a Snap-back erasure method which is preferably realized applying high magnitude sine waveform for the Vs erase cycles that drives a cell into snap-back breakdown which reduces the electron and hole trapping for all cells in the array.

It is an object of the present invention to provide an improved method for fabricating a snap-back Flash cell that has a source side that reduces the band to band effect of the source side.

The method of the invention fabricates the drain 14, side source 18 and source 20 regions in separate Photo/implant steps. This is an advantage because the invention can form a structure with the inventor's specifications of S/D concentrations and channel overlap/spacing that enable a EEPROM snap-back device to perform better than the conventional EEPROM cells. The cell of the invention has a heavily doped N+ drain to enhance C.H.E. programming and a lightly doped N source is used to reduce the band to band tunnel during the erase cycle. Moreover, the Side source 18 is formed before the sidewall spacers 32. This allows the Side source to be Implanted adjacent to the gate and have a minimal offset gate.

The present invention provides method to fabricate a snap-back flash EEPROMS device. The method begins by forming a gate structure 22 24 28 26 on a substrate. (See FIG. 5A). The gate structure comprises a gate dielectric layer 22 (e.g., tunnel oxide layer), a floating gate 24, integrate dielectric layer 28, and a control gate 26. A drain 14 is formed adjacent to the gate structure by an masking 51 and ion implant process. Next, a source side doped region 18 is formed adjacent to and under a portion of the gate structure 22 24 28 26 by an masking and ion implant process. Spacers 32 are now formed on the sidewalls of the gate structure. A source 20 is formed overlapping portion of the side source doped region 18 and adjacent to the spacers 32. The side source doped region has a lower dopant concentration than the source 20. This method forms a snap-back memory cell wherein the side source doped region 18 is used to apply a high voltage to operate the cell in a snap-back mode.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A shows a cross-sectional view of a conventional flash EEPROM cell, illustrating the trapped electrons in the tunneling oxide according to the prior art.

FIGS. 2A, 2B and 2C are conventional rectangular waveforms of the voltages applied to the respective control gate, source, and drain over the erase condition in accordance with the prior art.

FIGS. 3A, 3B, 3C, and 3D, show the preferred erase cycle voltage (including the sine waveform (Vs)) and gate current for the present invention.

DETAILED DESCRIPTION OF THE PREFERRED EMBODIMENTS

The present invention will be described in detail with reference to the accompanying drawings. The present invention provides a method of fabricating a snap-back flash memory cell. The snap-back flash memory cell is a special memory cell designed to be operated with snap-back operation. The snap-back operation of the snap-back flash cell is discuss in detail in the co-pending U.S. patent application Ser. No. 08/949,945 filed Oct. 14, 1997, entitled, "Snap-back Reduces The Electron And Hole Trapping In The Tunneling Oxide Of Flash EEPROM".

The snap-back breakdown operation of one snap-back flash cell in the array lowers the tunnel oxide electric field for all cells in the array. The snap-back breakdown generates a substrate current that reduces the electric field thereby reducing electron and hole trapping.

The table below shows a summary of the inventions' process to form a EEPROM cell that uses a snap back operation.

TABLE

Summary of process of the invention for making a Snap-back flash cell

Figure 4A:
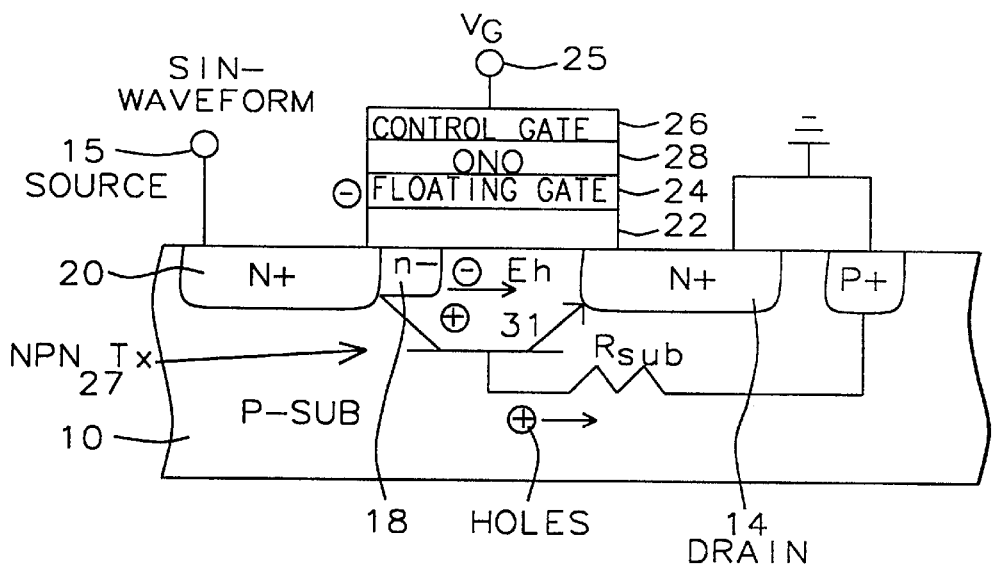
FIG. 4A shows an electrical schematic of the EEPROM cell during the snap-back erase operation of the present invention.
Figure 4B:
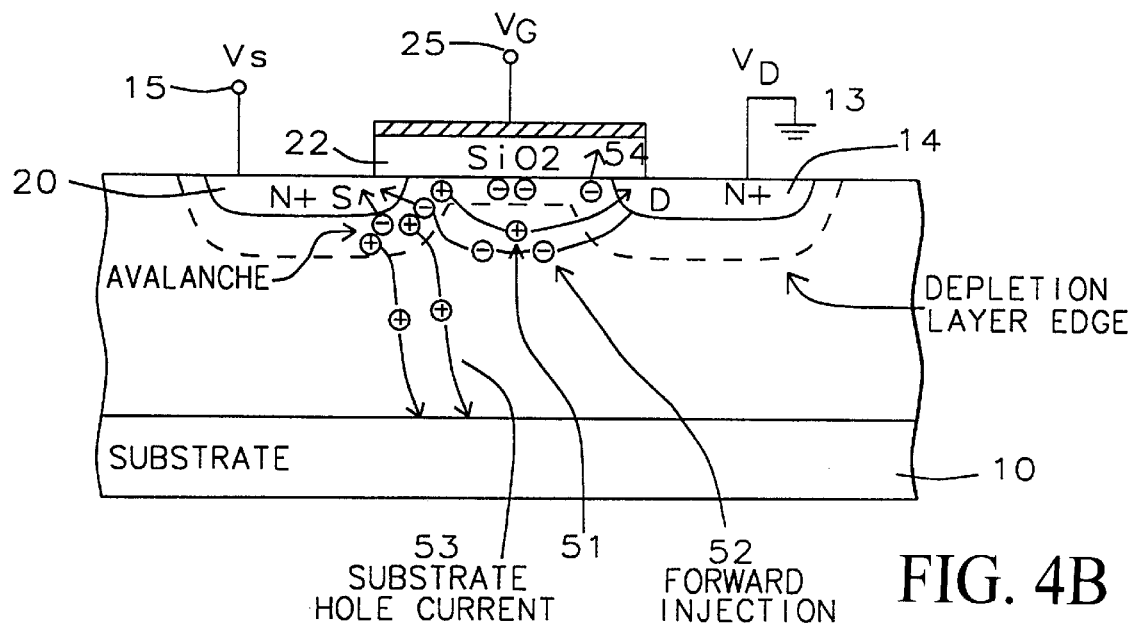
FIG. 4B shows an electrical schematic of the EEPROM cell during the hot carrier generation and snap-back erase operation of the present invention.
Figures 4C, 5A:
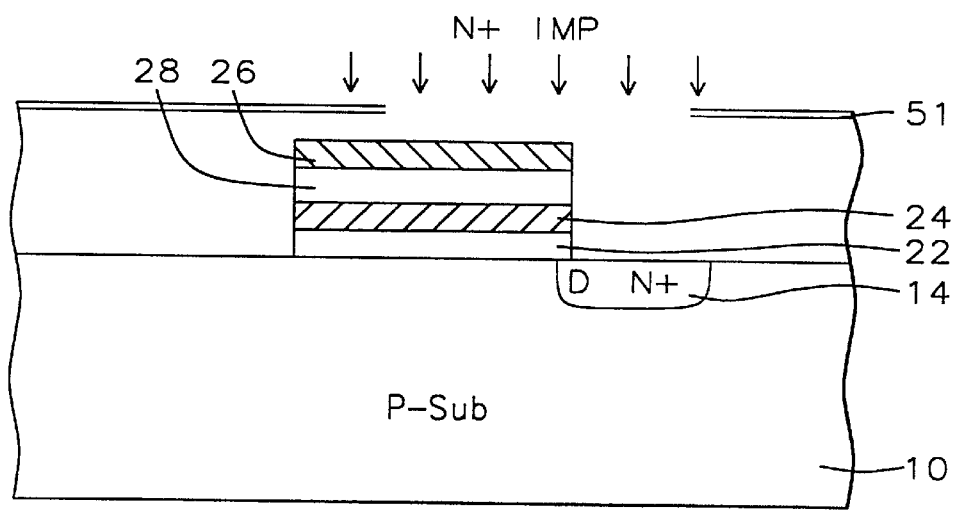
FIG. 4C is a table identifying some of the processes shown in FIG. 4B.
FIGS. 5A through 5E are cross sectional views for illustrating the method for making a snap-back flash cell according to the present invention.
Figure 5B:
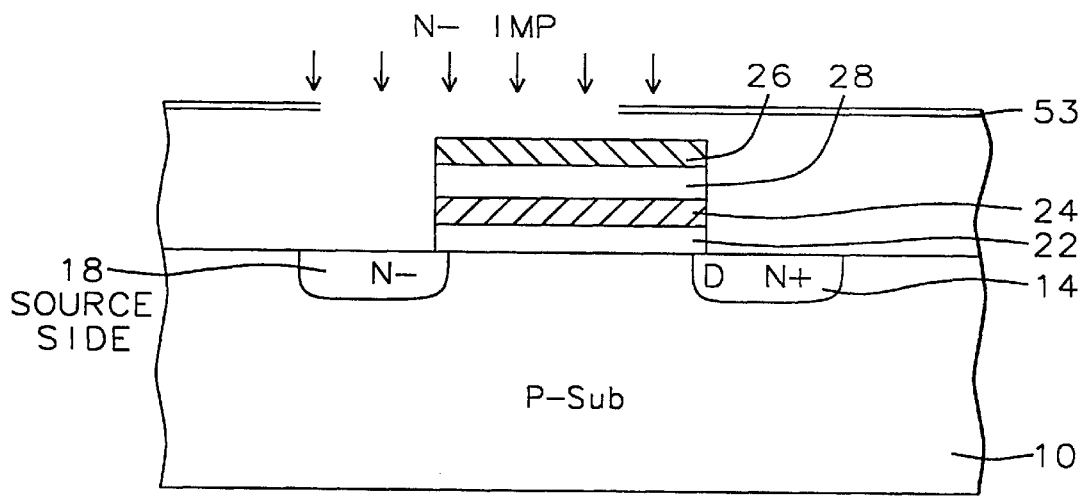
Figure 5C:
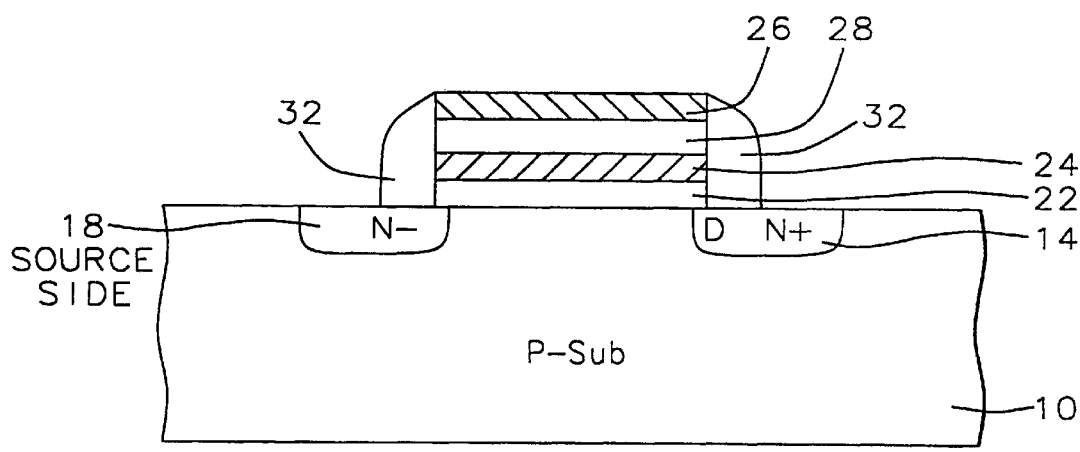
Figure 5D:
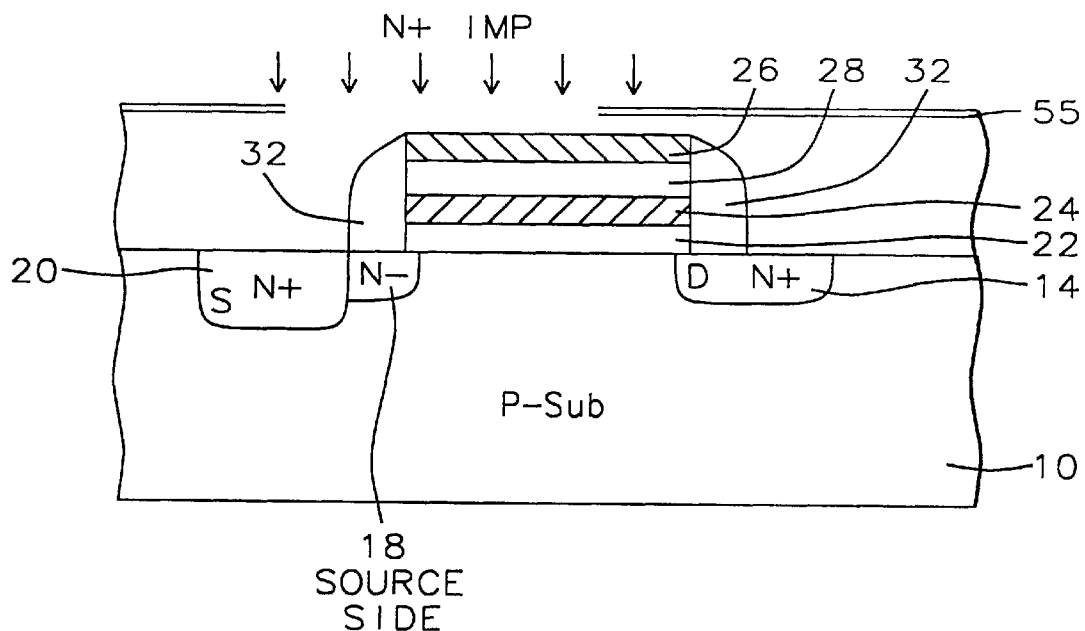
Figure 5E:
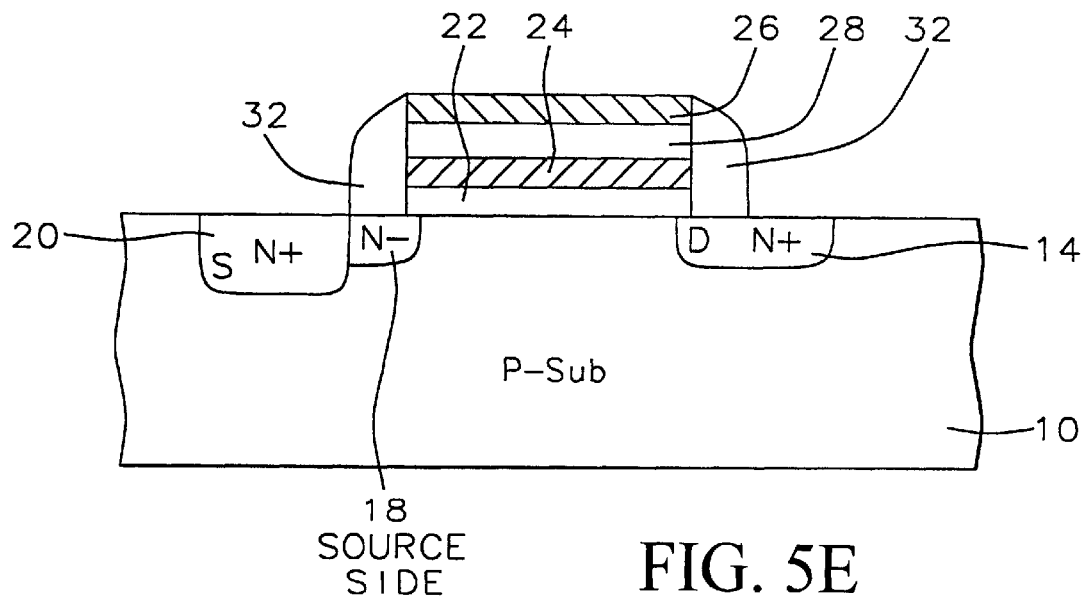

| Step | Structure Formed |
| --- | --- |
| 1 - See FIG. 5A | form gate structure 22 24 28 26 |
| 2 - See FIG. 5A | form drain 14 → N + I/I |
| 3 - See FIG. 5B | form side source doped region 18 → N − I/I |
| 4 - See FIG. 5C | form sidewall spacers 32 |
| 5 - see FIG. 5D | form source 20 → N + I/I |

The table below shows a summary of the preferred parameters of the inventions' EEPROM cell that uses a snap back operation.

TABLE

Preferred Parameters for the Invention's Snap Back EEPROM

| | parameter | Low limit | target | High limit |
|---|---|---|---|---|
| gate dielectric 22 | thickness material - | 50 Å | 100 Å silicon oxide | 150 Å |
| floating gate 24 | thickness, Materials | 500 | 1300 Å poly | 2000 |
| intergate dielectric | thickness | 100 Å | 200 Å | 300 Å |
| control gate 26 | thickness/ Materials | 500 Å | POLY -1500 Å WSi$_x$ - 1500 Å | 2500 Å |
| Drain 14 | Concentration (atom/cc) Dopant | 2E19 | As | 5E20 |
| Source side 18 | Concentration (atom/cc) Dopant | 5E17 | P | 5E18 |
| Source 20 | Concentration (atom/cc) Dopant | 1E19 | As | 8E20 |

I. Method to Form Snap Back Memory Cell

The method of fabricating a snap-back flash cell that is operated (e.g., erased) using a snap-back process begins as shown in FIG. 5A. A gate structure 22 24 28 26 is formed on a semiconductor substrate. The gate structure comprises a gate dielectric layer 22 (e.g., tunnel oxide layer), a floating gate 24, integrate dielectric layer 28, and a control gate 26. The gate structure has sidewalls.

The gate structure is formed by fabricating a gate dielectric layer 22 (e.g., tunnel oxide layer) over the substrate 10. Then a floating gate 24, preferably formed of a doped polysilicon, is formed over the tunnel oxide layer 22. Next, an intergate dielectric layer 28, preferably composed of ONO or silicon oxide, is formed over the floating gate. Subsequently, a control gate 26 is formed over the intergate dielectric layer 28. These layers are patterned using a photo and etch process to form a gate structure. The gate structure has sidewalls.

The gate structure preferably has a width in a range of between about 0.1 and 2.0 μm. Preferred parameters for the gate structure are shown above in the table.

As shown in FIG. 5A, a drain 14 is formed adjacent to the gate structure 22 24 28 26 by a photoresist masking and ion implant process. Preferably, a photoresist layer 51 is formed over the wafer with a drain opening over at least the drain 14. Dopants are implanted through the drain opening to form the drain. The photoresist layer 51 is then removed.

Preferably, the drain 14 has a n-type dopant of As or P, and most preferably As, and a n-type dopant concentration in a range of between about 1E19 and 8E20 atoms/cm$^3$ and more preferably between 2E19 and 5E20 atoms/cm$^3$.

An important feature of the invention is that the N+ drain 14 is formed before the spacers 32 to have a zero offset with the gate. Also, the drain is formed separately from the source to provide the Drain 14 and side source 18 with different implant concentrations and profiles which enable the snap-back cell of the invention to perform better that the conventional EEPROM memory cells.

Referring to FIG. 5B, a source side doped region 18 is formed adjacent to and under a portion of the gate structure 22 24 28 26 preferably by an masking and ion implant process. The source side doped region 18 underlies the gate structure a distance in a range of between about 200 and 2000 Å. This distance is important to have enough overlap area to erase the electrons from the floating gate 24.

Preferably, a photoresist layer 53 is formed over the wafer with a side source opening over at least the area where the side source doped region 18 will be formed. Dopants are implanted through the opening to form the drain. The photoresist layer 53 is removed.

The source side doped region 18 is preferably formed by a ion implant process using a n-type dopant of As or Phosphorous (P); and most preferably using P. The source side doped region 18 preferably has a n-type dopant concentration in a range of between about 1E17 and 8E18 atoms/cm$^3$ and more preferably between 5E17 and 5E18 atoms/cm$^3$. The Source side region 18 of the invention has a lower concentration than conventional EEPROM Source regions. In addition, the invention forms the source side region 18 before the spacers 32 to allow the source side to have portions that underlay the gate structure. These features allow the invention's cell to have better erase performance.

As show in FIG. 5C, spacers 32 are formed on the sidewalls of the gate structure. The spacers 32 preferably have a thickness in a range of between about 500 and 3000 Å, and are preferably formed of silicon oxide, silicon nitride (SiNO), or silicon oxynitride and most preferably silicon oxide.

As show in FIG. 5D, a source 20 is formed overlapping portions of the side source doped region 18 and adjacent to the spacers 32. The source 20 is preferably formed by a masking 55 and ion implant process. Preferably a photoresist layer 55 is formed over the wafer with a source opening over at least the area where the source 20 will be formed. Dopants are implanted through the opening to form the source. The photoresist layer 55 is then removed.

The source 20 has a higher dopant concentration than the source side region 18. The source 20 has a n-type dopant of As or P, and most preferably As, and a N-type dopant concentration in a range of between about 1E19 and 8E20 atoms/cm$^3$.

II. Benefits of the Method of the Invention

A summary of important features of the invention is shown below:

| Feature Of The Invention | Remark |
|---|---|
| Method is to produce EEPROM Cell that uses snapbackoperation | |
| The N+ Drain 14 is formed adjacent to the gate structure - FIG. 5A | Conventional EEPROM have Both Source and drain I/I at same time. |
| N− Source side region 18 only formed on one side (No LLD). FIG. 5B | Invention's source side reduces band to band effect |
| Ion Implant for N+ source 20 is performed after the spacers 32 are formed. The advantage is to pull the N+ source 20 (off set) away from the tunnel oxide 22 edge to avoid the hot hole generation during high source Voltage | Conventional EEPROM forms N+ source before spacers are formed therefore is not off set from gate. Both the Source and drain Ion Implanted at the same time. |
| The Snapback EEPROM cell of the invention has better performance than conventional EEPROM. The invention's Snapback EEPROM cell, with side source 18, can apply a high source voltage and keep the Electric field less than 10 Mev. | Conventional EEPROM can't apply high voltage to source during erase, due to band to band hot hole tunnel |

The method of the invention forms a snap-back memory cell wherein the side source doped region 18 is used to apply a high voltage to operate the cell in a snap-back mode. See section below on the snap back erase operation.

The side source 18 (FIG. 4A) has a low doping concentration where it overlaps the tunnel oxide. This is an advantage because it sustains high source breakdown Voltage (for the snap back operation) and reduces the Band to Band tunneling. See "Different Dependence of Band to Band and Fowler-Nordheim Tunneling on Source Doping concentration of an N-MOSFET", by Yuan Tang et al., IEEE Electron Device Letters, vol. 17, No. 11, November 1996, pp. 525–526. The source side region 18/Source 20 structure is not found in conventional EEPROM devices.

The structure and method of the invention has the benefits for EEPROM operation of reducing the Band-to-Band tunneling Current during high voltage and keeping the source to gate field under 10 MeV/um.

A major feature of the present invention is the N+ source implant (See FIG. 5D) after the spacer etch. For conventional EEPROM, the N+ source implant is before spacer formation. The invention's advantage is to pull the N+ source area 20 away from the tunnel oxide layer 22 edge, to avoid the hot hole generation during high source voltage of the snap back cycle.

III. Snap-Back ERASE Operation of the Snap-Back Flash Cell of the Invention

The snap back EEPROM cell of the invention can be operated in with conventional snap back waveforms. The preferred erase cycle for the snap-back cell of the invention is illustrated in FIGS. 3A 3B 3C 3D and 3E. The invention's erase cycle preferably uses a sine waveform to apply voltages Vs to the memory device. The preferred voltages of for a 5 V flash EEPROM erasing are given below in the table:

TABLE

Voltage and times for the Invention's Preferred Program and Erase cycles

| Operation | Vg | Vd | Vs | V sub |
|---|---|---|---|---|
| Erase Cycle Voltages | −15 ≦ Vg ≦ 0 V | Ground | sine wave form max peak V range is +2 V to +20 V (tgt = 5 V Sine wave form) | Ground |

The preferred voltages and times may vary with tunnel oxide, gate oxide thickness, P-well doping and N+ doping implantation concentration. The table below shows the preferred values for Vs and Vg as a function of tunnel oxide thickness.

TABLE

Preferred Values For Vs And Vg As A Function Of Tunnel Oxide Thickness

| Tunnel oxide thickness (+/10 Å) | 60 Å | 100 Å | 150 Å |
|---|---|---|---|
| peak (maximum) sine wave voltage Vs | 1 to 10 V | 2 to 15 V | 5 TO 20 V |
| control gate voltage Vg | 0 to −10 V | 0 to −15 V | 0 to −20 V |

The preferred period of the sine waveform Vs (shown in FIG. A)(i.e., only the positive part the sine wave cycle) of between 0.01 and 1000 ms for tunnel oxide thickness in a range of between about 50 and 160 Å. (See table above).

TABLE

Preferred Parameters For 100 Å Tunnel Oxide

| Parameters | units | Low | target | High |
|---|---|---|---|---|
| Sine Vs time period (∩) | ms | 0.01 | 1 | 1000 |
| Vs (max of sine wave) | V | 2 | 5 | 20 |
| Vg | V | 0 | −10 | −15 |
| Vd | V | floating | floating | floating |
| Vsub/well | V | grounded | grounded | grounded |

In more detail, as shown in table 3 above, for the erase cycle the positive sine waveform voltage to the source region preferably has a magnitude in the range of between about 2 and 12 volts and a period (shown in FIG. 3A)(i.e., only the positive part the sine wave cycle) of between 0.01 and 1000 ms. The substrate (or well region $V_{well}$ or $V_{p\text{-}well}$) is preferably grounded (at about 0 volts). The negative pulsed voltage (Vg) to the control gate preferably has a peak magnitude in the range of between about −5 and −1 volts.

The table below summarized the erase cycle of the invention and the theorized mechanisms.

TABLE

Summary of the Theorized Stages Of The Sine Wave Snap-back Erasure Method Of The Invention.

| Stage | Erase Operation |
|---|---|
| 1 | apply voltages as shown below:<br>See FIGS. 3A–3E<br>Vs Source: high positive voltage sine waveform<br>Vg Gate: negative voltage<br>Vd Drain: Ground<br>Vsub Bulk: Ground<br>Snap-back occurs: --- Critical electrical Field (10 MV/cm) |
| 2 | the vertical field caused F–N tunneling electron -→ the source junction |
| 3 | the electrons → horizontal field → generates a lot of electron/hole pairs |
| 4 | The generated holes travel to the p-substrate → turn on the drain junction -- turn on the n-p-n bipolar Tx<br>Results<br>every cell can operate without the high field stress (<= 10 MV/cm) |

A more detailed explanation of the preferred snap-back erase cycle is shown in co-pending U.S. patent application Ser. No. 08/949,945 filed Oct. 14, 1997, entitled; "Snap-back Reduces The Electron And Hole Trapping In The Tunneling Oxide Of Flash EEPROM" which is incorporate in its entirety by reference.

The invention's Snap back EEPROM cell has a different structure than conventional EEPROM cells. See e.g., U.S. Pat. No. 5,485,423 (Yang et al.), FIG. 1, Col. 1, lines 15 to 32). A major difference between the invention's EEPROM cell and conventional cell is the (Side source/source 18 20 structure. The snap back EEPROM of the invention has the N+ source 20 off set by the spacer 32 from the gate. In contrast, conventional EBPROM Sources are not off set from the gate. See U.S. Pat. No. 5,485,423(Fang et al.), FIG. 1.

The invention's 3 separate masking and I/I steps to form the drain, source side 18 and source. On the other hand, conventional EEPROM cell methods implant both the Source and Drain at the same time with the same doses. Also, the source region is not off set by a spacer distance from the gate. See e.g., U.S. Pat. No. 485,423 (Yang), FIG. 1, Col. 1, lines 15 to 32).

The invention's source structure provides advantages over conventional EEPROM's in snap back node. The invention's snapback EEPROM can apply high source voltage (because of the low doped source side 18 but keep the electric field less than 10 Mev that reduces the band to band to hole tunnel. The invention's side source 18 (FIG. 4A) has a low doping concentration where it overlaps the tunnel oxide 22. This low concentration Source side 18 reduces the band to band tunneling effect. The band to band effects are discussed in "Different Dependence of Band to Band and Fowler-Nordheim Tunneling on Source Doping concentration of an N-MOSFET", by Yuan Tang et al., IEEE Electron Device Letters, vol. 17, No. 11, November 1996, pp. 525–526. Conventional EEPROMs can't apply too high voltages to the source during erase, due to the band to band hot hole tunnel (e.g., created by the non-off set source). Moreover, the inventor recognized the operational snap back advantages of the invention's side source structure.

The process of the invention is better than conventional EEPROM processes because the low doped source side can maintain the electric Field (E) to less than 10 Mev during erase. An E less than 10 Mev reduces the damage to the tunnel oxide 22. The invention's snap back cell be used with the regular snap back wave forms (e.g., FIGS. 2A, 2B and 2C) and are preferably used with the Vs sine wave forms (E.g., FIGS. 3A to 3E.)

While the invention has been particularly shown and described with reference to the preferred embodiments thereof, it will be understood by those skilled in the art that various changes in form and details may be made without departing from the spirit and scope of the invention.

What is claimed is:

1. The method of fabricating a snap-back flash EEPROM cell that is operated using a snap-back erase process comprising:

(1) forming a gate structure on a substrate, said gate structure comprising a gate dielectric layer, a floating gate, intergate dielectric layer and a control gate; said gate structure having sidewalls;

(2) forming a drain in said substrate adjacent to said gate structure by a masking and ion implant process; said drain is comprised of a first conductivity type dopant;

(3) forming only a source side doped region adjacent to and under a portion of said gate structure a first distance by a masking and ion implant process; said side source doped region extending from the surface of said substrate to a depth below said surface of said substrate; said source side doped region is comprised of a first conductivity type dopant;

(4) forming spacers on said sidewalls of said gate structure after forming said drain and said source side doped region;

(5) forming a source overlapping portion of said side source doped region and adjacent to said spacers; said source formed by an masking and ion implant process; said side source doped region having a lower dopant concentration than said source; said source is comprised of a first conductivity type dopant;

wherein no other doped regions are formed adjacent to said gate structure or said spacers;

thereby forming a snap-back memory cell wherein said side source doped region is used to apply a high voltage to operate said snap-back flash EEPROM cell in a snap-back erase mode;

wherein said snap-back erase mode comprises:

a) applying a positive sine waveform voltage (Vs) to said source during an entire erase cycle;

b) grounding said substrate during said entire erase cycle;

c) grounding said drain during said entire erase cycle;

d) simultaneously applying a negative voltage to said control gate device during said entire erase cycle; and whereby said positive sine waveform voltage applied to said source reduces an electric field in said gate dielectric layer which reduces electron and hole trapping.

2. The method of fabricating a snap-back flash EEPROM cell that is operated using a snap-back erase process comprising:

1) forming a gate structure on a substrate, said gate structure comprising a gate dielectric layer, a floating gate intergate dielectric layer and a control gate; said gate structure having sidewalls; said gate structure having a first and a second side;

2) forming a drain in said substrate adjacent to said first side said gate structure by a masking and ion implant process; said drain having a n-type dopant composed of As, and a n-type dopant concentration in a range of between about 1E19 and 8E20 atoms/cm$^3$;

3) forming only a source side doped region adjacent to and under a portion of said second side of said gate structure a first distance by an masking and ion implant process; a lightly doped drain overlapping said drain is not formed; said source side doped region has a n-type dopant composed of P, and a n-type dopant concentration in a range of between about 1E17 and 8E18 atoms/cm$^3$; said source side doped region extending from the surface of said substrate to a depth below said surface of said substrate;

4) forming spacers on said sidewalls of said gate structure after forming said drain and said source side doped region;

5) forming a source overlapping portion of said side source doped region and adjacent to said spacers; said source has a n-type dopant composed of As, said source side doped region underlying a portion of said gate structure a first distance in a range of between about 200 and 2000 Å;

wherein no other doped regions are formed adjacent to said gate structure or said spacers;

thereby forming a snap-back memory cell wherein said side source doped region is used to apply a high voltage and operating said snap-back flash EEPROM cell in a snap-back erase mode.

3. The method of claim 1 wherein said gate structure has a width in a range of between about 0.1 and 2.0 µm.

4. The method of claim 1 wherein said drain has a n-type dopant selected from the group consisting of As and P, and a n-type dopant concentration in a range of between about 1E19 and 8E20 atoms/cm$^3$.

5. The method of claim 1 wherein said drain has a n-type dopant composed of As, and a n-type dopant concentration in a range of between about 1E19 and 8E20 atoms/cm$^3$.

6. The method of claim 1 wherein said source side doped region has a n-type dopant composed of P, and a n-type dopant concentration in a range of between about 1E17 and 1E18 atoms/cm$^3$ and said first distance is between about 200 and 2000 Å.

7. The method of claim 1 wherein said spacers have a thickness in a range of between about 200 and 3000 Å, and are formed of a material selected from the group consisting of silicon oxide, silicon oxynitride and silicon oxide.

8. The method of claim 1 wherein said source has a n-type dopant selected from the group consisting of As and P, and a N-type dopant concentration in a range of between about 1E19 and 8E20 atoms/cm$^3$.

9. The method of claim 1 wherein said source has a n-type dopant composed of As, and a N-type dopant concentration in a range of between about 1E19 and 8E20 atoms/cm$^3$.

10. The method of claim 1 wherein said source side doped region underlying a portion of said gate stricture a first distance in a range of between about 500 and 2000 Å.

11. The method of claim 2 wherein said gate structure has a width in a range of between about 0.1 and 2.0 µm.

12. The method of claim 2 wherein said spacers have a thickness in a range of between about 200 and 3000 Å, and are formed of a material selected from the group consisting of silicon oxide, silicon oxynitride and silicon oxide.

13. The method of fabricating a snap-back flash EEPROM cell that is operated using a snap-back erase process comprising:

1) forming a gate structure on a substrate, said gate structure comprising a gate dielectric layer, a floating gate intergate dielectric layer and a control gate; said gate structure having sidewalls; said gate structure having a first and a second side;

2) forming a drain in said substrate adjacent to said first side said gate structure by a masking and ion implant process; said drain having a n-type dopant composed of As, and a n-type dopant concentration in a range of between about 1E19 and 8E20 atoms/cm$^3$;

3) forming a source side doped region adjacent to and under a portion of said second side of said gate structure a first distance by an masking and ion implant process; a lightly doped drain overlapping said drain is not formed; said source side doped region has a n-type dopant composed of P, and a n-type dopant concentration in a range of between about 1E17 and 8E18 atoms/cm$^3$; said source side doped region extending from the surface of said substrate to a depth below said surface of said substrate;

4) forming spacers on said sidewalls of said gate structure;

5) forming a source overlapping portion of said side source doped region and adjacent to said spacers; said source has a n-type dopant composed of As, and a N-type dopant concentration in a range of between about 1E19 and 8E20 atoms/cm$^3$; said source side doped region underlying a portion of said gate structure a first distance in a range of between about 200 and 2000 Å;

thereby forming a snap-back memory cell.

14. The method of fabricating a snap-back flash EEPROM cell that is operated using a snap-back erase process comprising:

(1) forming a gate structure on a substrate, said gate structure comprising a gate dielectric layer, a floating gate, intergate dielectric layer and a control gate; said gate structure having sidewalls;

(2) forming a drain in said substrate adjacent to said gate structure by a masking and ion implant process; said drain is comprised of a first conductivity type dopant;

(3) forming only a source side doped region adjacent to and under a portion of said gate structure a first distance by a masking and ion implant process; said side source doped region extending from the surface of said substrate to a depth below said surface of said substrate; said source side doped region is comprised of a first conductivity type dopant;

(4) forming spacers on said sidewalls of said gate structure after forming said drain and said source side doped region;

(5) forming a source overlapping portion of said side source doped region and adjacent to said spacers; said source formed by an masking and ion implant process; said side source doped region having a lower dopant concentration than said source; said source is comprised of a first conductivity type dopant; wherein no other doped regions are formed adjacent to said gate structure or said spacers; thereby forming a snap-back memory cell.

* * * * *